United States Patent
Lin et al.

(10) Patent No.: US 9,412,912 B2
(45) Date of Patent: Aug. 9, 2016

(54) METHOD FOR TRANSFERRING LIGHT-EMITTING ELEMENTS ONTO A PACKAGE SUBSTRATE

(71) Applicant: PLAYNITRIDE INC., Tainan (TW)

(72) Inventors: Ching-Liang Lin, Tainan (TW); Yu-Hung Lai, Tainan (TW); Tzu-Yang Lin, Tainan (TW); Pei-Hsin Chen, Tainan (TW)

(73) Assignee: Playnitride, Inc., Tainan (TW)

(*) Notice: Subject to any disclaimer, the term of this patent is extended or adjusted under 35 U.S.C. 154(b) by 0 days.

(21) Appl. No.: 14/952,227

(22) Filed: Nov. 25, 2015

(65) Prior Publication Data

US 2016/0155906 A1 Jun. 2, 2016

(30) Foreign Application Priority Data

Dec. 2, 2014 (TW) .............................. 103141778 A

(51) Int. Cl.
| | |
|---|---|
| H01L 21/00 | (2006.01) |
| H01L 33/48 | (2010.01) |
| H01L 23/00 | (2006.01) |
| H01L 25/075 | (2006.01) |
| H01L 33/62 | (2010.01) |
| H01L 25/00 | (2006.01) |

(52) U.S. Cl.
CPC .............. *H01L 33/483* (2013.01); *H01L 24/95* (2013.01); *H01L 25/0753* (2013.01); *H01L 25/50* (2013.01); *H01L 33/62* (2013.01); *H01L 2933/0033* (2013.01)

(58) Field of Classification Search
CPC ... H01L 25/50; H01L 25/0753; H01L 25/167; H01L 33/62; H01L 33/486; H01L 24/95; H05K 2203/0776; H05K 3/303; Y10T 29/4913

See application file for complete search history.

(56) References Cited

U.S. PATENT DOCUMENTS

| | | | | | |
|---|---|---|---|---|---|
| 7,625,780 | B2* | 12/2009 | Jacobs | .................... | H01L 24/95 257/E21.499 |
| 7,774,929 | B2* | 8/2010 | Jacobs | .................... | H01L 24/31 29/825 |
| 7,874,474 | B2* | 1/2011 | Kim | ..................... | B23K 1/0016 228/175 |
| 7,952,107 | B2* | 5/2011 | Daniels | .................. | H01L 24/75 257/100 |

* cited by examiner

*Primary Examiner* — Michael Trinh
(74) *Attorney, Agent, or Firm* — LeClairRyan

(57) ABSTRACT

A method for transferring light-emitting elements onto a package substrate includes: providing a light-emitting unit including a temporary substrate and light-emitting elements; disconnecting the light-emitting elements from the temporary substrate to allow the light-emitting elements to float on a fluid; adjusting spacings between the light-emitting elements to have a predetermined size by controlling flow of the fluid; placing a package substrate into the fluid, followed by aligning the light-emitting elements with connecting pads of the package substrate so as to correspondingly place the light-emitting elements on the connecting pads; and removing the package substrate with the light-emitting elements from the fluid.

16 Claims, 4 Drawing Sheets

METHOD FOR TRANSFERRING LIGHT-EMITTING ELEMENTS ONTO A PACKAGE SUBSTRATE

CROSS-REFERENCE TO RELATED APPLICATION

This application claims priority of Taiwanese Patent Application No. 103141778, filed on Dec. 2, 2014.

FIELD

The disclosure relates to a method for transferring light-emitting elements onto a package substrate, more particularly to a method for transferring light-emitting elements onto a package substrate using fluid.

BACKGROUND

The transfer of light-emitting elements, such as LEDs, from an epitaxial substrate onto a package substrate, requires high alignment accuracy. Often, the spacing between light-emitting elements on the epitaxial substrate does not match the spacing between predetermined positions of the package substrate on which light-emitting elements are to be mounted. A conventional approach to this problem has been to individually transfer each of the light-emitting elements onto the package substrate such that adjustments in spacing on the package substrate are possible. Another conventional approach to the problem has been to dispose the light-emitting elements on a stretchable supporting film (such as a blue tape), on which the light-emitting elements are arranged in a two-dimensional array, followed by stretching the stretchable supporting film so as to expand the spacing between the light-emitting elements to predetermined sizes, and transferring the light-emitting elements onto a substrate intended for use.

However, the first conventional approach is meticulous, time consuming, and requires relatively high accuracy in aligning the light-emitting elements onto the package substrate. Moreover, advancements in technology have contributed to a general reduction in the size of light-emitting elements (such as micro LEDs), demanding an even higher level of accuracy, and raising the standards in the transfer and alignment of light-emitting elements onto package substrates. Regarding the second conventional approach mentioned above, a required step of transferring each of the light-emitting elements from the stretched supporting film, i.e., the blue tape, onto the package substrate may result in damage to the light-emitting elements during removal of the same.

SUMMARY

Therefore, an object of the disclosure is to provide a method that can alleviate at least one of the aforesaid drawbacks of the prior art.

According to the disclosure, a method for transferring light-emitting elements onto a package substrate may include:

providing a light-emitting unit including a temporary substrate and a plurality of light-emitting elements, each of the light-emitting elements being removably connected to the temporary substrate;

disconnecting the light-emitting elements from the temporary substrate to allow the light-emitting elements to float on a fluid;

adjusting spacings between the light-emitting elements to have a predetermined size by controlling flow of the fluid;

providing a package substrate including a plurality of connecting pads arranged to have spacings of the predetermined size;

placing the package substrate into the fluid, followed by aligning the light-emitting elements with the connecting pads of the package substrate so as to correspondingly place the light-emitting elements on the connecting pads of the package substrate; and removing the package substrate together with the light-emitting elements from the fluid.

In light of the foregoing, a method for transferring the light-emitting elements onto the package substrate is provided according to the present disclosure by using the fluid as a dispersing medium. The spacings between the light-emitting elements may be changed by controlling the flow of the fluid, so as to accurately transfer the light-emitting elements onto the package substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
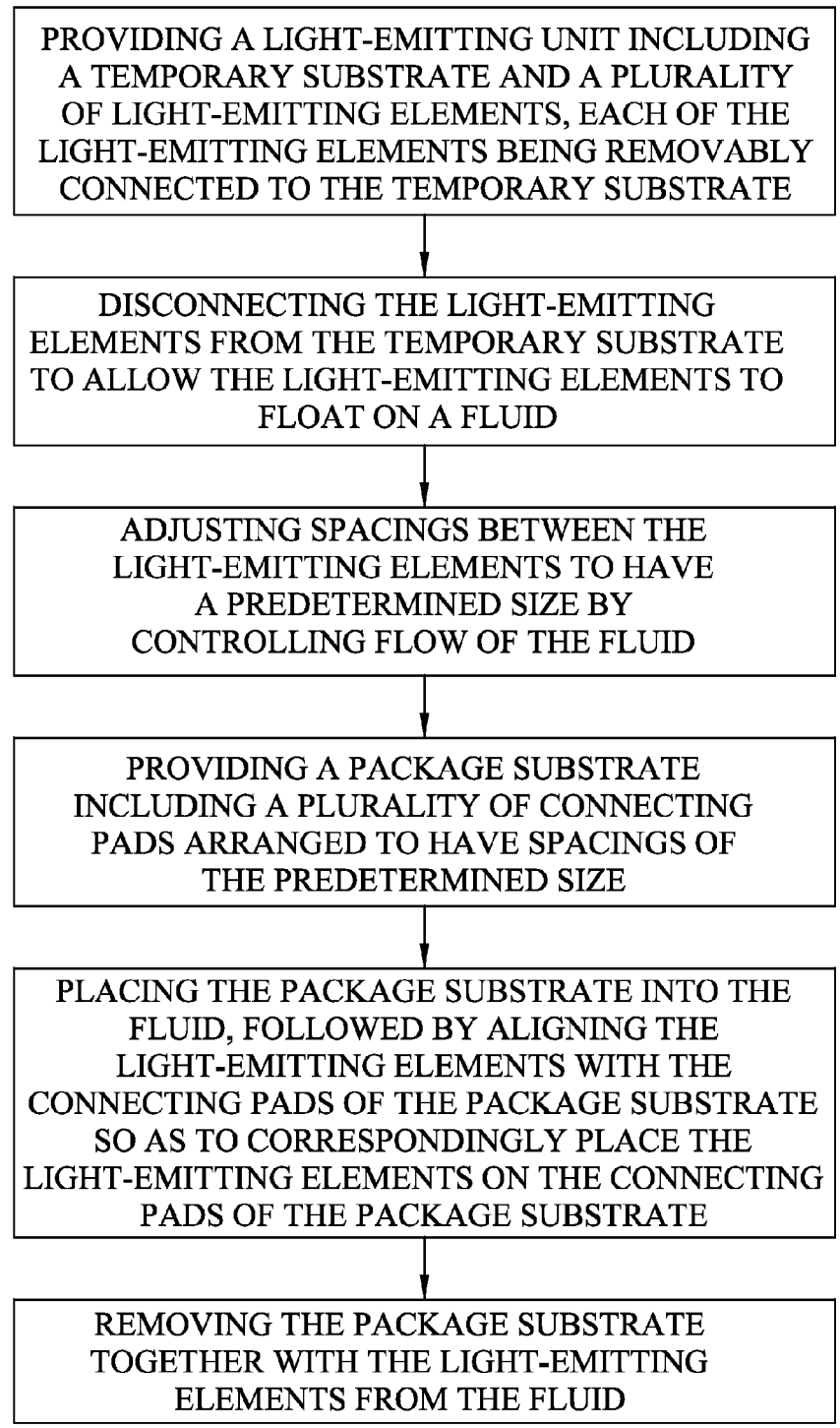
FIG. 1 is a flow chart of a first exemplary embodiment of a method for transferring light-emitting elements onto a package substrate according to the present disclosure.

Before the disclosure is described in greater detail, it should be noted that like elements are denoted by the same reference numerals throughout the disclosure.

Figure 2:
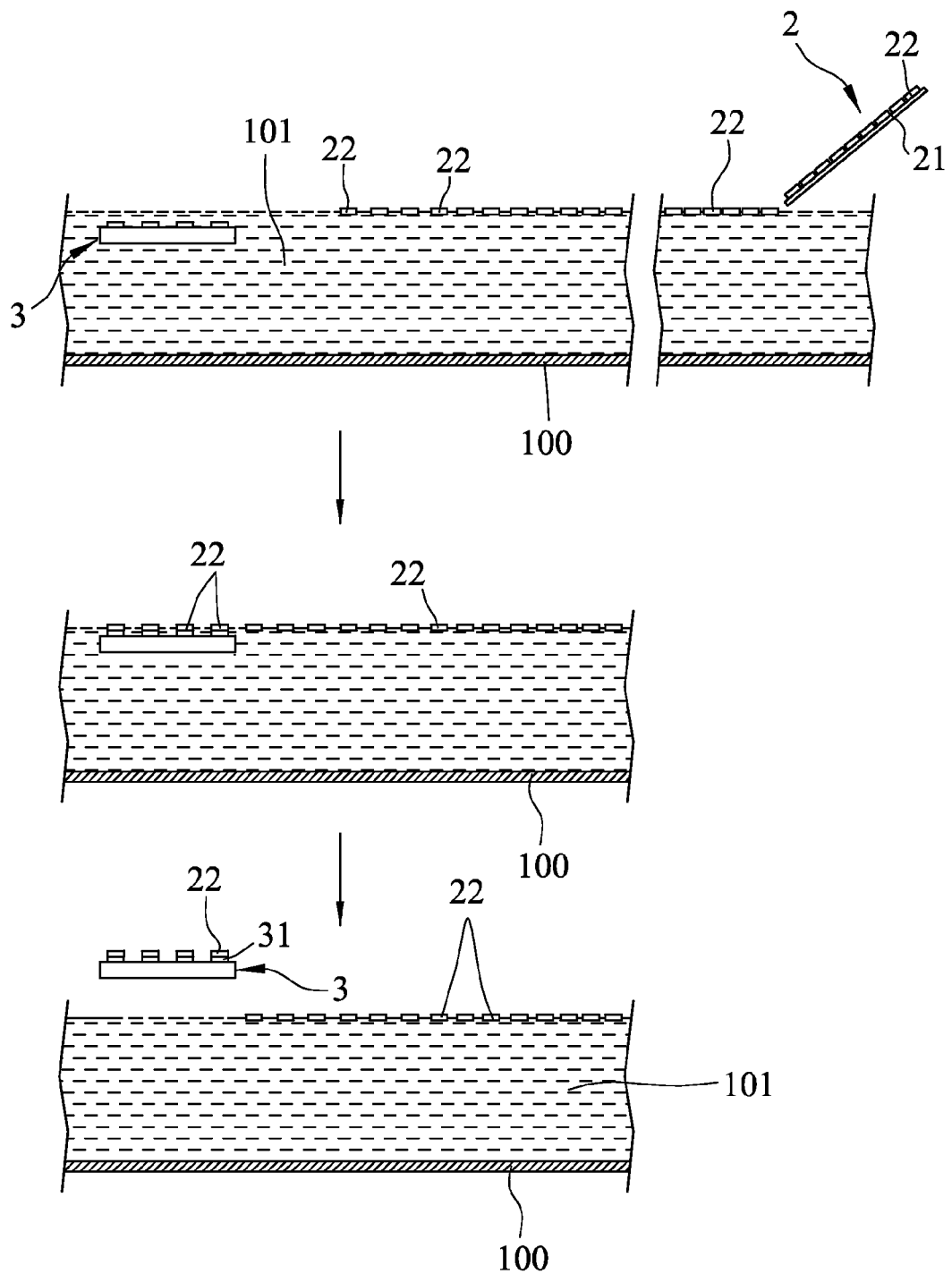
FIG. 2 is a schematic diagram of the first exemplary embodiment, illustrating consecutive steps of the method.
Figure 3:
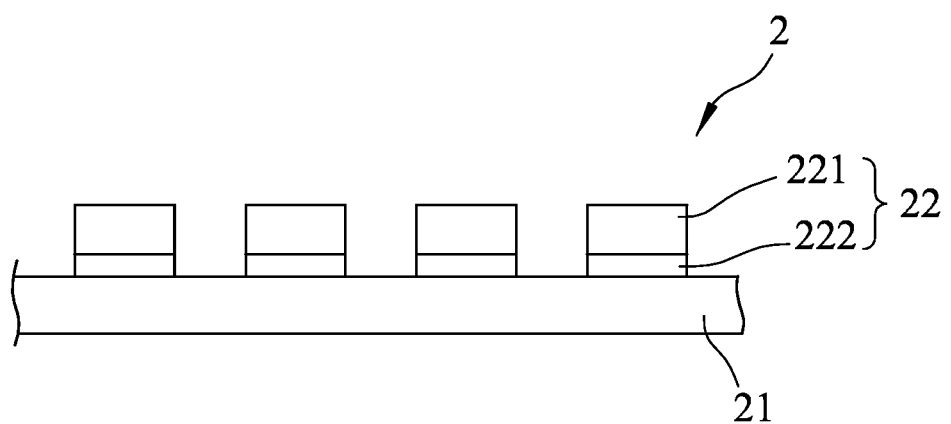
FIG. 3 is a fragmentary side view illustrating a light-emitting unit provided in the method of the first exemplary embodiment.

Referring to FIGS. 1 to 3, the first exemplary embodiment of a method for transferring light-emitting elements onto a package substrate is shown to include steps (A) to (F) as follows.

Step (A): providing a light-emitting unit 2 (see FIG. 3). As shown in FIG. 3, the light-emitting unit 2 includes a temporary substrate 21 and a plurality of light-emitting elements 22. Each of the light-emitting elements 22 is supported by and removably connected to the temporary substrate 21. The temporary substrate 21 may be a sapphire substrate, a light release tape, a thermal release tape, or a blue tape. The sapphire substrate may be an epitaxial substrate on which the light-emitting elements 22 were originally grown, and the light release tape, the thermal release tape or the blue tape may be a carrying substrate to which the light-emitting elements 22 were transferred. The light release tape has reduced adhesion strength after being irradiated with light having a predetermined wavelength such as UV light. The thermal release tape has reduced adhesion strength after being heated to a predetermined temperature. Since configurations of the blue tape, the light release tape, and thermal release tape have been readily appreciated by those skilled in the art, further details are omitted herein for the sake of brevity.

Each of the light-emitting elements 22 has a semiconductor structure 221 that is disposed on the temporary substrate 21 and that is operable to emit light within a predetermined wavelength range (i.e., to emit green, blue or red light), and an alloy layer 222 formed on the semiconductor structure 221 opposite to the temporary substrate 21. In this embodiment, the dimensions of the light-emitting elements 22, such as height or width, may be identical or different. It should be noted that the light-emitting elements 22 may have dimensions of width ranging from 1 μm to 100 μm. In certain embodiments, the light-emitting elements 22 may have dimensions ranging from 3 μm to 40 μm, and a distance between two adjacent light-emitting elements 22 may range from 2 μm to 35 μm. The alloy layer 222 may be made of an alloy having a eutectic point ranging from 140° C. to 300° C. The alloy may be, but is not limited to, AuSn, AgSn, AuGe, AlIn or AuIn.

Step (B): disconnecting the light-emitting elements from the temporary substrate 21 to allow the light-emitting elements 22 to float on a fluid 101 (see FIG. 2).

To be specific, in this embodiment, when the temporary substrate 21 is a sapphire substrate or a blue tape, the step of disconnecting the light-emitting elements 22 from the temporary substrate 21 may be conducted by fluid flushing. When the temporary substrate 21 is a light release tape or a thermal release tape, the step of disconnecting the light-emitting elements 22 from the temporary substrate 21 to allow the light-emitting elements 22 to float on the fluid 101 may be conducted by heating or irradiating.

Step (C): adjusting spacings between the light-emitting elements 22 to have a predetermined size by controlling flow of the fluid (see FIG. 2).

It should be noted that, in this embodiment, the fluid 101 may have a density greater than that of the light-emitting elements 22 to allow the light-emitting elements 22 to float on the fluid 101. The fluid 101 may be a polar solvent, a non-polar solvent, or a magnetic fluid.

To be specific, in this embodiment, the fluid 101 is accommodated in a tank 100. When the fluid 101 is a polar or non-polar solvent, the tank 100 may be provided with a plurality of controllers (such as hydro control valves, not shown) to control a flow rate and a flow direction of the fluid 101. As such, the spacings between the light-emitting elements 22 floating on the fluid 101 can be adjusted to be the predetermined size. It should be noted that, in this embodiment, since the light-emitting elements 22 are arranged in a two-dimensional manner, the spacings between the light-emitting elements 22 can be simultaneously adjusted using the controllers. Alternatively, the spacings between the light-emitting elements 22 may be adjusted in one direction followed by adjustment in another direction, i.e., to control the fluid 101 to flow in one direction at a time. In certain embodiments, the fluid 101 may have a boiling point that is less than 140° C. for the convenience of subsequent removal of the fluid 101. In certain embodiments, the fluid 101 may have a viscosity ranging from 0.5 to 100 cp (at 25° C.) If the viscosity is too low, the fluid 101 may not drive the light-emitting elements 22 effectively. On the other hand, if the viscosity is too high, the fluid 101 may have residue attached onto the surface of the light-emitting elements 22 which is difficult to remove.

In certain embodiments where the fluid 101 is a magnetic fluid, the step (C) of adjusting the spacings between the light-emitting elements 22 can be conducted by exerting an external magnetic field to control the flow rate and the flow direction of the fluid 101.

Step (D): providing a package substrate 3 including a plurality of connecting pads 31 arranged to have spacings of the predetermined size (see FIG. 2).

In certain embodiments, the package substrate 3 may be selected from a printed circuit board (PCB), a thin film transistor (TFT) substrate, and a complementary metal-oxide semiconductor (CMOS) substrate. The connecting pads 31 may be made of an alloy having a eutectic point ranging from 140° C. to 300° C. Such alloy may be, but is not limited to, AuSn, AuSn, AuGe, AlIn, or AuIn.

Step (E): placing the package substrate 3 into the fluid 101, followed by aligning the light-emitting elements 22 with the connecting pads 31 of the package substrate 3 so as to correspondingly place the light-emitting elements 22 on the connecting pads 31 of the package substrate 3 (see FIG. 2).

Step (F): removing the package substrate 3 together with the light-emitting elements 22 from the fluid 101 (see FIG. 2).

After Step (F), the light-emitting elements 22 and the connecting pads 31 can be heated above the eutectic point so as to bond the light-emitting elements 22 correspondingly with the connecting pads 31.

It is noted that, after step (F), residue of the fluid 101 on the light-emitting elements 22 can be removed by heating. However, in order to prevent heat damage to the connecting pads 31, the boiling point of the fluid 101 must be lower than the eutectic point of the connecting pads 31 when the fluid 101 is a common solvent. In certain embodiments where the fluid 101 is a magnetic fluid, the step of removing the fluid 101 from the light-emitting elements 22 may be conducted by exerting an external magnetic field.

By using the fluid 101 as a dispersing medium, the spacings between the light-emitting elements 22 may be adjusted to have the predetermined size and the light-emitting elements 22 can be transferred to the package substrate 3 accurately.

Figure 4:
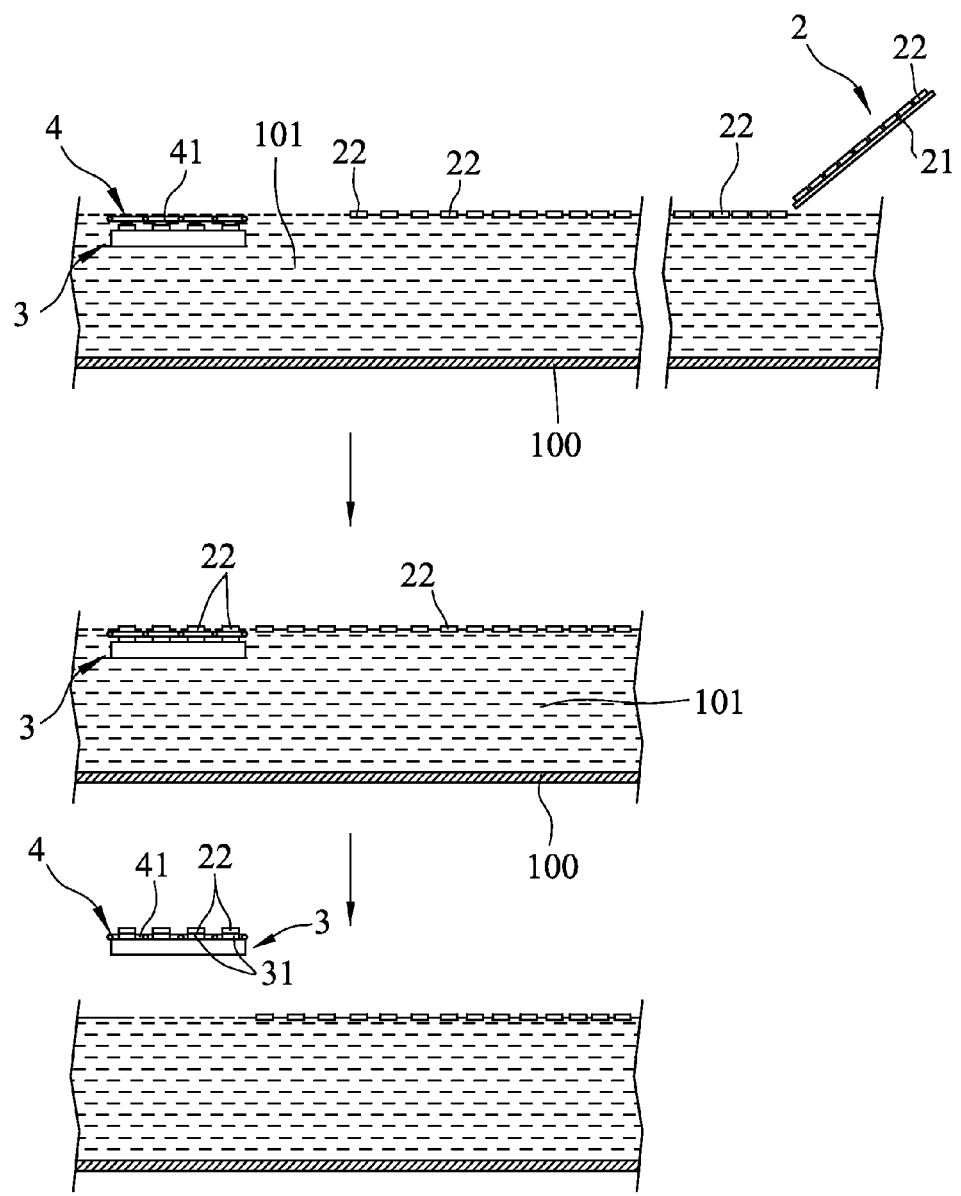
FIG. 4 is a schematic diagram illustrating a second exemplary embodiment according to the present disclosure, illustrating consecutive steps of the method for transferring the light-emitting elements.

Referring to FIG. 4, the second exemplary embodiment of the method for transferring light-emitting elements onto a package substrate according to the disclosure is similar to that of the first exemplary embodiment. The difference between the first and second exemplary embodiments resides as follows.

As shown in FIG. 4, the method of the second exemplary embodiment further includes a step of providing a net member 4 disposed on the package substrate 3. The net member 4 has a plurality of meshes 41 each corresponding in position to the connecting pads 31, and the size of each of the meshes 41 is not smaller than that of the light-emitting elements 22. Moreover, step (E) of the second exemplary embodiment is conducted using the net member 4. More specifically, the package substrate 3 is placed into the fluid 101 together with the net member 4, where the net member 4 is disposed on the package substrate 3 and the meshes 41 of the net member 4 may correspondingly retain the light-emitting elements 22 therein. By using the net member 4 to arrange spacings of the light-emitting elements 22 with the predetermined size, the light-emitting elements 22 of the second exemplary embodiment can be more precisely aligned with the connecting pads 31 of the package substrate 3.

In certain embodiments, in order to accurately align the light-emitting elements 22 with the connecting pads 31 of the package substrate 3, the net member 4 may exhibit hydrophobic (or hydrophilic) surface properties, and the fluid 101 can exhibit different surface properties from that of the net member 4. For example, the fluid 101 can be a polar solvent (or a non-polar solvent) that may be repulsed by the net member 4 due to the surface properties thereof, so that less fluid 101 remains in the meshes 41 of the net member 4 during Step (E), and the light-emitting elements 22 can be effectively positioned within the meshes 41 without being adversely affected by the fluid 101.

It should be further noted that the light-emitting elements 22 may exhibit specific surface properties, such as hydrophobic or hydrophilic characteristics, so as to have an affinity to the fluid 101 which exhibits surface properties corresponding to that of the light-emitting elements 22. Therefore, the light-emitting elements 22 dispersed in the fluid 101 may have fluid particles adhered thereon, so that the light-emitting elements 22 are repelled by each other due to the fluid particles. For example, in certain embodiments where the light-emitting elements 22 exhibit hydrophilic surface properties, the fluid 101 can be a polar solvent. In such embodiments, the hydrophilic surface of the light-emitting elements 22 can be adhered with polar particles to let the surface of the light-emitting elements 22 having the same charges, so as to separate the light-emitting elements 22 by repelling forces. Likewise, in certain embodiments where the light-emitting elements 22 exhibit hydrophobic surface properties, the fluid 101 can be a non-polar solvent. In these ways, distribution of the light-emitting elements 22 on the fluid 101 can be further enhanced during Step (C).

In certain embodiments, each of the light-emitting elements 22 may have at least one hydrophilic (or hydrophobic) functional group provided thereon for exhibiting hydrophilic (or hydrophobic) surface properties. It is worth noting that the spacings between the light-emitting elements 22 can also be controlled by adjusting the mass content of hydrophilic (or hydrophobic) functional groups provided thereon.

To sum up, by utilizing flow of the fluid 101 to adjust the spacings between light-emitting elements 22 to the predetermined size, the light-emitting elements 22 can be accurately aligned and transferred onto the package substrate 3. As such, the aforementioned problems of the conventional method can be prevented.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for transferring light-emitting elements onto a package substrate, comprising:
    providing a light-emitting unit including a temporary substrate and a plurality of light-emitting elements, each of the light-emitting elements being removably connected to the temporary substrate;
    disconnecting the light-emitting elements from the temporary substrate to allow the light-emitting elements to float on a fluid;
    adjusting spacings between the light-emitting elements to have a predetermined size by controlling flow of the fluid;
    providing a package substrate including a plurality of connecting pads arranged to have spacings of the predetermined size;
    placing the package substrate into the fluid, followed by aligning the light-emitting elements with the connecting pads of the package substrate so as to correspondingly place the light-emitting elements on the connecting pads of the package substrate; and
    removing the package substrate together with the light-emitting elements from the fluid.

2. The method of claim 1, wherein the step of adjusting the spacings between the light-emitting elements is conducted by controlling a flow rate and a flow direction of the fluid.

3. The method of claim 2, wherein the light-emitting elements are arranged in a two-dimensional manner, and the spacings between the light-emitting elements are simultaneously adjusted.

4. The method of claim 1, wherein the fluid is a magnetic fluid, and the step of adjusting the spacings between the light-emitting elements is conducted by exerting an external magnetic field to control the flow of the fluid.

5. The method of claim 1, wherein each of the light-emitting elements exhibits hydrophilic surface properties, and the fluid is a polar solvent.

6. The method of claim 5, wherein each of the light-emitting elements has a hydrophilic functional group provided thereon for exhibiting the hydrophilic surface properties.

7. The method of claim 1, wherein each of the light-emitting elements exhibits hydrophobic surface properties, and the fluid is a non-polar solvent.

8. The method of claim 7, wherein each of the light-emitting elements has a hydrophobic functional group provided thereon for exhibiting the hydrophobic surface properties.

9. The method of claim 1, wherein the step of adjusting the spacings between the light-emitting elements comprises a step of providing a net member disposed on the package substrate, the net member having a plurality of meshes each corresponding in position to the connecting pads, the step of aligning the light-emitting elements with the connecting pads being conducted using the net member.

10. The method of claim 9, wherein the net member exhibits hydrophilic surface properties, and the fluid is a non-polar solvent.

11. The method of claim 9, wherein the net member exhibits hydrophobic surface properties, and the fluid is a polar solvent.

12. The method of claim 1, wherein the fluid has a boiling point that is less than 140° C.

13. The method of claim 1, wherein the fluid has a viscosity ranging from 0.5 to 100 cp.

14. The method of claim 1, wherein the package substrate is one of a printed circuit board, a thin film transistor substrate, and a complementary metal-oxide-semiconductor substrate.

15. The method of claim 1, wherein the connecting pads are made of an alloy having a eutectic point ranging from 140° C. to 300° C.

16. The method of claim 1, wherein the step of disconnecting the light-emitting elements from the temporary substrate is conducted by fluid flushing.

* * * * *